US012620635B2

(12) United States Patent (10) Patent No.: US 12,620,635 B2
Li et al. (45) Date of Patent: May 5, 2026

(54) PRINTED CIRCUIT BOARD, BATTERY MODULE, BATTERY PACK, AND ELECTRICAL DEVICE

(71) Applicant: CONTEMPORARY AMPEREX TECHNOLOGY (HONG KONG) LIMITED, Hong Kong (CN)

(72) Inventors: Xin Li, Ningde City (CN); Zhaohang Shi, Ningde City (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 758 days.

(21) Appl. No.: 17/945,146

(22) Filed: Sep. 15, 2022

(65) Prior Publication Data

US 2023/0207897 A1 Jun. 29, 2023

Related U.S. Application Data

(63) Continuation of application No. PCT/CN2022/088389, filed on Apr. 22, 2022.

(30) Foreign Application Priority Data

Dec. 29, 2021 (CN) .......................... 202123382798.5

(51) Int. Cl.
*H01M 10/42* (2006.01)
*H05K 1/09* (2006.01)
(Continued)

(52) U.S. Cl.
CPC ............ *H01M 10/425* (2013.01); *H05K 1/09* (2013.01); *H05K 1/111* (2013.01); *H05K 1/181* (2013.01);
(Continued)

(58) Field of Classification Search
CPC ................................................... H01M 10/425
(Continued)

(56) References Cited

U.S. PATENT DOCUMENTS 5,709,338 A 1/1998 Shirai et al.
6,070,321 A * 6/2000 Brofman .............. H05K 3/3436
257/E23.079
(Continued)

FOREIGN PATENT DOCUMENTS

CN 2773945 Y 4/2006
CN 103281874 A 9/2013
(Continued)

OTHER PUBLICATIONS

International Search Report issued Sep. 28, 2022, in corresponding International Patent Application No. PCT/CN2022/088389 (with English language translation), 5 pages.
(Continued)

*Primary Examiner* — Stanley Tso
(74) *Attorney, Agent, or Firm* — XSENSUS LLP

(57) ABSTRACT

This application discloses a printed circuit board, a battery module, a battery pack, and an electrical device. The printed circuit board may include: a substrate, a pad, a solder paste layer, a component body, and a support assembly. The pad may be disposed above the substrate. The solder paste layer may be disposed above the pad. The component body may be disposed above the solder paste layer. The support assembly may be disposed between the pad and the component body to form a degassing space between the component body and the solder paste layer.

13 Claims, 2 Drawing Sheets

(51) Int. Cl.
| | |
|---|---|
| *H05K 1/11* | (2006.01) |
| *H05K 1/181* | (2026.01) |

(52) U.S. Cl.
CPC ... *H01M 2220/20* (2013.01); *H05K 2201/035* (2013.01)

(58) Field of Classification Search
USPC ........................................................ 174/260
See application file for complete search history.

(56) References Cited

U.S. PATENT DOCUMENTS

| | | | | |
|---|---|---|---|---|
| 9,368,466 | B2 * | 6/2016 | Patel ........................ | H01L 24/16 |
| 10,157,873 | B1 * | 12/2018 | Cho ......................... | H01L 24/11 |
| 2006/0261131 | A1 * | 11/2006 | Hirata .................. | H05K 3/3485 228/101 |
| 2007/0001297 | A1 | 1/2007 | Higasa et al. | |
| 2014/0004392 | A1 | 1/2014 | Sung et al. | |
| 2015/0021760 | A1 * | 1/2015 | Lin ................... | H01L 23/49811 257/737 |
| 2015/0069829 | A1 * | 3/2015 | Dulle .................. | H01M 50/528 307/9.1 |
| 2015/0200171 | A1 * | 7/2015 | Yu ........................... | H01L 24/81 438/107 |
| 2016/0057869 | A1 | 2/2016 | Wei et al. | |
| 2018/0093338 | A1 | 4/2018 | Edlinger | |
| 2022/0020715 | A1 * | 1/2022 | Lewandowski ........ | G06N 10/00 |
| 2022/0109258 | A1 * | 4/2022 | Coakley .............. | H01R 12/613 |

FOREIGN PATENT DOCUMENTS

| | | | |
|---|---|---|---|
| CN | 108172521 | A | 6/2018 |
| CN | 109874237 | * | 6/2019 |
| CN | 109874237 | A | 6/2019 |
| CN | 112397820 | A | 2/2021 |
| JP | H08-293670 | A | 11/1996 |
| JP | 2000-068637 | A | 3/2000 |
| JP | 2003258415 | A * | 9/2003 |
| JP | 2014-514722 | A | 6/2014 |

OTHER PUBLICATIONS

Extended European Search Report issued Dec. 12, 2023 in European Patent Application No. 22761933.5, citing above-listed references.
Office Action issued Jan. 25, 2024 in Japanese Patent Application No. 2022-554365 with English translation thereof.
1 Office Action issued Sep. 4, 2025 in European Patent Application No. 22761933.5.

\* cited by examiner

Related Art

PRINTED CIRCUIT BOARD, BATTERY MODULE, BATTERY PACK, AND ELECTRICAL DEVICE

CROSS-REFERENCE TO RELATED APPLICATIONS

The present application is a continuation of International Application No. PCT/CN2022/088389, filed Apr. 22, 2022, which claims priority to Chinese Patent Application No. 202123382798.5, filed on Dec. 29, 2021 and entitled "PRINTED CIRCUIT BOARD, BATTERY MODULE, BATTERY PACK, AND ELECTRICAL DEVICE", each of which is incorporated herein by reference in its entirety.

TECHNICAL FIELD

This application relates to the technical field of batteries, and in particular, to a printed circuit board, a battery module, a battery pack, and an electrical device.

BACKGROUND

Energy conservation and emission reduction is key to sustainable development of the automobile industry. Electric vehicles have become an important part of the sustainable development of the automobile industry by virtue of energy saving and environmental friendliness. Battery technology is crucial to development of the electric vehicles.

A printed circuit board is a circuit board commonly used in a battery module. Commonly used electronic parts need to be welded onto a pad of a substrate of the PCB (Printed Circuit Board, printed circuit board). However, the welding effect is affected by many factors, and the welding effect of finished electronic parts is usually inferior and tends to affect normal use of the PCB.

SUMMARY

In view of the problems above, this application provides a printed circuit board, a battery module, a battery pack, and an electrical device to reduce a void rate at the bottom of a component body by 30% to 40% and reduce an offset of the component body (MOS transistor) in the related art.

According to a first aspect, this application provides a printed circuit board, including: a substrate, a pad, a solder paste layer, a component body, and a support assembly. The pad is disposed above the substrate. The solder paste layer is disposed above the pad. The component body is disposed above the solder paste layer. The support assembly is disposed between the pad and the component body to form a degassing space between the component body and the solder paste layer.

In the technical solutions of embodiments of this application, soldering lugs are placed symmetrically at the bottom of the electronic part to steadily hold the electronic part and form an off-contact structure as a gas escape space at the bottom of the electronic part. By using a difference of melting points between the solder paste and the soldering lugs, gas generated by the solder paste during melting can be evacuated through the off-contact structure, thereby preventing the gas from forming a void at the position of the solder paste. The soldering lugs begin to melt only after the solder paste has melted, thereby reasonably ensuring that most of the gas can be volatilized in all directions. At a flank of the electronic part, the position of the electronic part is limited by a position limiter. By changing the thickness of the solder paste at the bottom of the position limiter, the position limiter is enabled to implement position limitation, thereby preventing an offset of the electronic part during melting and welding.

In some embodiments, one end of the support assembly is connected to the component body, and the other end of the support assembly extends into the solder paste layer to connect to the pad. By melting the solder paste layer and the support assembly in a soldering oven at a high temperature, the component body and the limiting post thereof are efficiently fixed to the pad on the substrate.

In some embodiments, the support assembly includes at least two pillars. This facilitates supporting of the component body. In addition, the support assembly facilitates lifting of the component body, and helps to ensure the volatilization of gas and a relatively high welding speed.

In some embodiments, the support assembly is axially symmetrically arranged along a vertical centerline of the component body. The axially symmetrically arranged support assembly ensures that balanced supporting of the component body, and minimizes a horizontal offset in a process of melting the support assembly and lowering the component body.

In some embodiments, the pillars are tin slugs. A melting point of the tin slugs is higher than a melting point of the solder paste, effectively ensuring the effect of the degassing space.

In some embodiments, a melting point of the support assembly is greater than or equal to a melting point of the solder paste layer. This effectively ensures that the solder paste layer is melted before the support assembly. In this way, time is enough for exhausting the gas from the degassing space before the process of melting the support assembly.

In some embodiments, a height of a pillar is greater than a thickness of the solder paste layer, thereby effectively ensuring that the pillar can lift the component body to form the degassing space.

In some embodiments, a fixing assembly for preventing an offset in a case of connecting the component body to the pad is disposed between the component body and the pad, thereby further reducing the offset during the welding of the component body.

In some embodiments, the fixing assembly includes a solder paste zone and a limiting post. The solder paste zone is disposed on the pad. One end of the limiting post is connected to the component body, and the other end of the limiting post is connected to the solder paste zone. The limiting post facilitates a steady supporting and limiting structure to be formed at the flank of the component body.

In some embodiments, a thickness of the solder paste zone is greater than a thickness of the solder paste layer. By increasing the thickness of the solder paste zone, the originally unconnected limiting post is attached to the thickened solder paste to prevent the component body from being offset.

In some embodiments, the limiting post is a pin, and the pin is an inherent component pin of the component body. The number of pin structures is usually two, but not limited to two, and may be more than two, thereby facilitating limitation of the position of the component body.

In some embodiments, the limiting post is in an inverted L shape, thereby facilitating a steady supporting and limiting structure to be formed at the flank of the component body.

According to a second aspect, this application provides a battery module. The battery module includes the printed circuit board according to the foregoing embodiment.

According to a third aspect, this application provides a battery pack. The battery pack includes the battery module according to the foregoing embodiment.

According to a fourth aspect, this application provides an electrical device. The electrical device includes the battery pack according to the foregoing embodiment. The battery pack is configured to provide electrical energy.

Based on the foregoing technical solutions, beneficial effects of this application are as follows:

With the support assembly disposed optimally, a symmetrical support assembly is disposed at the bottom of the component body to lift up the component body to form a degassing space. Due to the difference of melting points between the support assembly and the solder paste, it is ensured that the gas generated in a gradual melting process of the solder paste and the support assembly can volatilize in all directions through the degassing space, thereby reducing the scope of voids formed at a molten contact position of the solder paste.

With the fixing assembly disposed optimally, in a case that the fixing assembly is an inherent component pin of the component body, the component pin is used to limit the position, and the thickness of the solder paste zone at the bottom of the component pin is increased, so that the component pin can contact the solder paste when remaining unwelded. Through the contact between the component pin and the solder paste on the pad, the component body is prevented from being offset.

The foregoing description is merely an overview of the technical solutions of this application. The following expounds specific embodiments of this application to enable a clearer understanding of the technical solutions of this application, enable implementation based on the content of the specification, and make the foregoing and other objectives, features, and advantages of this application more evident and comprehensible.

BRIEF DESCRIPTION OF DRAWINGS

The drawings are intended to enable a further understanding of this application and constitute a part of the specification hereof. The embodiments of this application together are intended to interpret this application, but not to constitute any limitation on this application.

In the drawings, the same components are represented by the same reference numerals. The drawings are merely illustrative, but not necessarily drawn to scale.

To describe the technical solutions in the embodiments of this application or in the related art more clearly, the following outlines the drawings to be used in the description of the embodiments of this application or the related art. Evidently, the drawings outlined below are merely one or more embodiments of this application, and a person of ordinary skill in the art may derive other drawings from such drawings without making any creative efforts.

Figure 1:
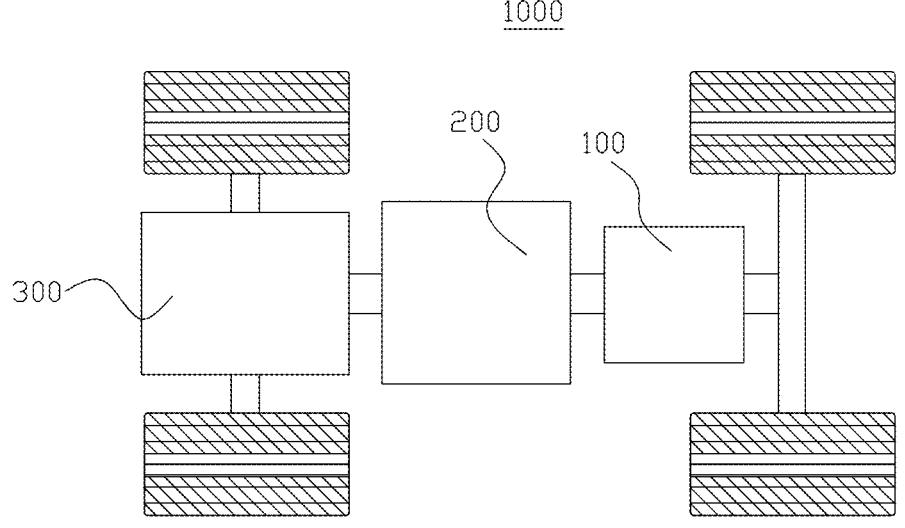
Figure 2:
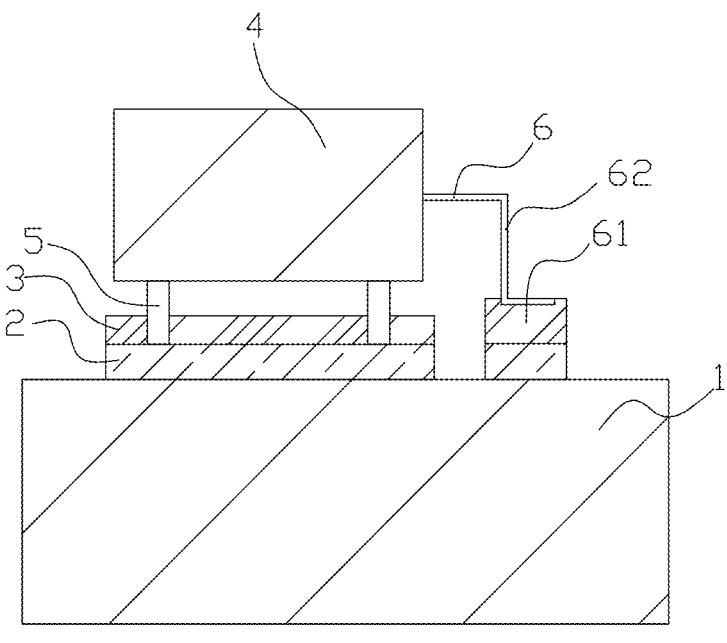
Figure 3:
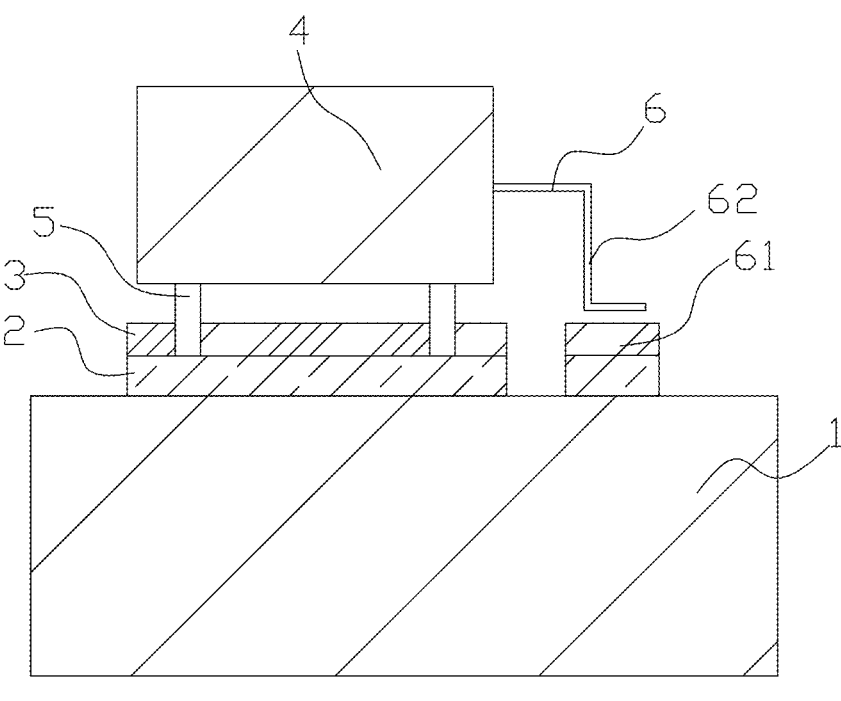

FIG. 1 is a schematic structural diagram of a vehicle according to some embodiments of this application;

FIG. 2 is a schematic structural diagram of a printed circuit board according to some embodiments of this application; and FIG. 3 is a schematic structural diagram of a printed circuit board in the related art.

REFERENCE NUMERALS 1. substrate; 2. pad; 2. solder paste layer; component body; support assembly; fixing assembly; 61. solder paste zone; 62. limiting post.

DETAILED DESCRIPTION OF EMBODIMENTS

Embodiments of the technical solutions of this application are described in detail below with reference to the drawings. The following embodiments are merely intended to describe the technical solutions of this application more clearly, and are merely exemplary but without hereby limiting the protection scope of this application.

Unless otherwise defined, all technical and scientific terms used herein have the same meanings as usually understood by a person skilled in the technical field of this application. The terms used herein are merely intended for describing specific embodiments but are not intended to limit this application. The terms "include" and "contain" and any variations thereof used in the specification, claims, and brief description of drawings of this application are intended as non-exclusive inclusion.

In the description of the embodiments of this application, the technical terms "first" and "second" are merely intended to distinguish different objects but not intended to indicate or imply relative importance or implicitly specify the number of the indicated technical features, the specific order, or order of priority. In the description of the embodiments of this application, unless otherwise expressly specified, "a plurality of" means two or more.

Reference to "embodiment" herein means that a specific feature, structure or characteristic described with reference to the embodiment may be included in at least one embodiment of this application. Reference to this term in different places in the specification does not necessarily represent the same embodiment, nor does it represent an independent or alternative embodiment in a mutually exclusive relationship with other embodiments. A person skilled in the art explicitly and implicitly understands that the embodiments described herein may be combined with other embodiments.

In the description of embodiments of this application, the term "and/or" merely indicates a relationship between related items, and represents three possible relationships. For example, "A and/or B" may represent the following three circumstances: A alone, both A and B, and B alone. In addition, the character "I" herein generally indicates an "or" relationship between the item preceding the character and the item following the character.

In the description of embodiments of this application, the term "a plurality of" means two or more (including two). Similarly, "a plurality of groups" means two or more groups (including two groups), and "a plurality of pieces" means two or more pieces (including two pieces).

In the description of embodiments of this application, a direction or a positional relationship indicated by the terms such as "center", "longitudinal", "transverse", "length", "width", "thickness", "up", "down", "before", "after", "left", "right", "vertical", "horizontal", "top", "bottom", "in", "out", "clockwise", "counterclockwise", "axial", "radial", and "circumferential" is a direction or positional relationship based on the illustration in the drawings, and is merely intended for ease or brevity of description of embodiments of this application, but not intended to indicate or imply that the indicated device or component is necessarily located in the specified direction or constructed or operated in the specified direction. Therefore, such terms are not to be understood as a limitation on embodiments of this application.

In the description of this application, unless otherwise expressly specified and qualified, the technical terms such as "mounting", "concatenation", "connection", and "fixing" need to be understood in a broad sense, for example, understood as a fixed connection or a detachable connection or understood as being integrated into a whole; or understood be as a mechanical connection or an electrical connection, a direct connection or an indirect connection implemented through an intermediary; or understood as interior communication between two components or interaction between two components. A person of ordinary skill in the art understands the specific meanings of the terms in the embodiments of this application according to the context.

Currently, as can be seen from the market trend, the application of power batteries is increasingly extensive. Power batteries are not only used in energy storage power systems such as hydro, thermal, wind, and solar power stations, but also widely used in electric means of transport such as electric bicycles, electric motorcycles, and electric vehicles, and used in many other fields such as military equipment and aerospace. The market demand for power batteries keeps expanding with the widening of the fields to which the power batteries are applicable.

As an electrical energy storage device, a power battery system is one of the core components of a new energy electric vehicle. The electric vehicle not only needs a high amount of charge to meet the driving conditions, but also needs to be capable of coping with some special circumstances. Currently, a battery pack 100 in a new energy vehicle may employ a variety of battery cells that fulfill given specifications, such as cylindrical 18650 cells and prismatic cells. Currently, a main process of manufacturing a matched power battery system according to specific voltage and capacity required by different electric vehicles is as follows: first, assembling a plurality of battery cells of the same specification into a battery module, and then assembling a plurality of battery modules into a battery pack 100, and finally, assembling a plurality of battery packs 100 into a power battery box as an energy storage device available to the electric vehicle. A printed circuit board is disposed in the battery module. A complete structure of the printed circuit board is formed by welding a component body 4 onto a substrate 1. In the description below, a MOS transistor is used as an example of the component body 4. When the MOS transistor is welded to the substrate 1, a solder paste of an appropriate thickness is printed onto a pad 2 on the substrate 1 through a stencil. The MOS transistor is directly placed on the solder paste, and fed into a soldering oven for welding. When the temperature reaches 217° C., the solder paste melts. After the molten solder paste is cooled down, the MOS transistor is fixed onto the pad 2 by use of the solder paste. However, gas generated in the melting process is unable to be volatilized in time, and forms a number of voids on the solder paste. The voids are bubbles formed by the gas that remains in the solder paste. When a support assembly 5 is disposed at the bottom of the MOS transistor to lift the MOS transistor, the solder paste of the same thickness printed by the stencil is no longer enough to limit the position of a component pin at a flank of the MOS transistor, that is, to limit the position of the limiting post 62. Consequently, the MOS transistor is unable to prevent an offset in the welding process by use of the component pin, and the MOS transistor is offset from the pad 2 by more than 25%.

In order to reduce the conventional void rate of the MOS transistor as high as 30% to 40%, the applicant carries out studies and finds that a symmetrical support assembly 5 may be disposed at the bottom of the MOS transistor. The melting point of the solder paste is 217° C., and the melting point of a soldering lug selected for the support assembly 5 is 217° C. to 227° C. When the solder paste melts, the soldering lug is still in a solid state, thereby forming a gas escape space. The temperature continues rising, and the soldering lug melts. The component body 4 subsides to contact the solder paste to form a solder joint. By lifting the MOS transistor, a gas escape space is formed. The gas can be volatilized in all directions, thereby reducing the scope of voids formed at the molten contact position of the solder paste. In order to alleviate the problem that the MOS transistor is offset greatly, the applicant carries out studies and finds that a pin of a soldering component of the MOS transistor is lower than the body. When the MOS transistor body contacts the soldering lug, the component pin of the MOS transistor also contacts the solder paste on the pad 2, and thereby can prevent the component body 4 from being offset. However, with the soldering lug disposed, a gap is prone to exist between the bottom of the component pin and the solder paste at the bottom. In this case, when a to-be-welded component is fed to into the soldering oven, an offset is prone to occur in the melting process. Therefore, the thickness of the solder paste at the bottom of the component pin may be increased so that the component pin can contact the solder paste and, when remaining unwelded, limit the position of the MOS transistor at the flank. This effectively ensures that the offset of the MOS transistor is greatly reduced in the melting process in the soldering oven.

Based on the above considerations, in order to reduce the conventional void rate of the MOS transistor as high as 30% to 40% and reduce the offset of the MOS transistor, the inventor carries out in-depth studies and has designed a printed circuit board, in which a symmetrical support assembly 5 is disposed at the bottom of the MOS transistor. The symmetrical support assembly 5 ensures that the MOS transistor is steadily disposed above the solder paste and forms a gas escape space at the same time. By increasing the thickness of the solder paste zone 61 at the bottom of the component pin of the MOS transistor, the bottom of the component pin contacts the solder paste zone 61 before the MOS transistor is fed into the soldering oven, and the position of the MOS transistor can be limited by the component pin.

In such a printed circuit board, the symmetrical support assembly 5 can lift the MOS transistor so as to be off-contact from the bottom of the MOS transistor. After the solder paste is melted, the support assembly 5 also begins to melt slowly. At this time, the MOS transistor gradually subsides. At the same time, the gas generated by melting can volatilize in all directions from the space at the bottom of the MOS transistor, thereby effectively reducing the void rate of the MOS transistor. The void rate of the MOS transistor can be reduced from a conventional range of 30% to 40% to a range of 10% to 20%. In the thickened solder paste zone 61 under the component pin, when the MOS transistor subsides, the component pin can also subside synchronously with the melting of the solder paste zone 61. The component pin can effectively reduce the offset of the MOS transistor in the welding process. The offset of the MOS transistor beyond the pad 2 declines from the conventional over 25% to just a slight offset.

The battery pack 100 disclosed in embodiments of this application is applicable to, but without being limited to, electrical devices such as a vehicle, watercraft, or aircraft.

An embodiment of this application provides an electrical device powered by a battery pack. The electrical device may be, but without being limited to, a mobile phone, a tablet, a notebook computer, an electric toy, an electric tool, an electric power cart, an electric vehicle, a ship, a spacecraft, and the like. The electric toy may include stationary or mobile electric toys, such as a game console, an electric car toy, an electric ship toy, an electric airplane toy, and the like. The spacecraft may include an airplane, a rocket, a space shuttle, a spaceship, and the like.

For ease of description in the following embodiments, a vehicle 1000 is used as an example of the electrical device according to an embodiment of this application.

Referring to FIG. 1, FIG. 1 is a schematic structural diagram of a vehicle 1000 according to some embodiments of this application. The vehicle 1000 may be an oil-fueled vehicle, a natural gas vehicle, or a new energy vehicle. The new energy vehicle may be a battery electric vehicle, a hybrid electric vehicle, a range-extended electric vehicle, or the like. A battery pack 100 is disposed inside the vehicle 1000. The battery pack 100 may be disposed at the bottom, front, or rear of the vehicle 1000. The battery pack 100 may be configured to supply power to the vehicle 1000. For example, the battery pack 100 may serve as an operating power supply of the vehicle 1000. The vehicle 1000 may further include a controller 200 and a motor 300. The controller 200 is configured to control the battery pack 100 to supply power to the motor 300, for example, to start or navigate the vehicle 1000, or meet the operating power requirements of the vehicle in operation.

In some embodiments of this application, the battery pack 100 serves not only as an operating power supply of the vehicle 1000, but may also serve as a drive power supply of the vehicle 1000 to provide driving power for the vehicle 1000 in place of or partially in place of oil or natural gas.

According to some embodiments of this application, referring to FIG. 2 and FIG. 3, FIG. 2 is a schematic structural diagram of a printed circuit board according to some embodiments of this application, and FIG. 3 is a schematic structural diagram of a printed circuit board in the related art.

According to some embodiments of this application, this application provides a printed circuit board, including: a substrate 1, a pad 2, a solder paste layer 3, a component body 4, and a support assembly 5. The pad 2 is disposed above the substrate 1. The solder paste layer 3 is disposed above the pad 2. The component body 4 is disposed above the solder paste layer 3. The support assembly 5 is disposed between the pad 2 and the component body 4 to form a degassing space between the component body 4 and the solder paste layer 3.

The substrate 1 is a copper-clad laminate. Generally, substrate materials for printed circuit boards are divided into two categories: rigid substrate materials and flexible substrate materials. The copper-clad laminate is a typical variety of rigid substrate materials. The copper-clad laminate is made in the following process: impregnating a reinforced material with a resin adhesive, and drying, cutting, and stacking the material into a blank, and then cladding the blank with a copper foil, using a steel plate as a die, and putting the copper-clad blank into a hot press machine at a high temperature and a high pressure to form the copper-clad laminate.

The pad 2 is a basic integral unit of surface mount technology, and is configured to form a pad pattern of a printed circuit board. The pad pattern is various pad combinations designed for special types of components.

The solder paste layer 3 is a layered structure formed by solder paste. Also known as soldering paste, the solder paste is gray in color, and is a new type of soldering material that came into being with the emergence of the SMT (Surface Mounted Technology) surface mount technology. The solder paste is a paste-like mixture formed by mixing tin solder powder, flux, and other surfactants, thixotropic agents, and the like, and is mainly used for the welding of electronic parts such as PCB surface resistors, capacitors, and ICs in the SMT sector.

The component body 4 is stand-alone in an electronic circuit. A stand-alone part is referred to as a device if, when passed through by an electrical current, the part can change the current in frequency and amplitude or change the flow direction of the current, while other stand-alone parts are referred to as components. In a semiconductor circuit, transistors (triodes, diodes, thyristors, and the like) are devices, while resistors, capacitors, and inductors are components, which are collectively called electronic parts.

The support assembly 5 may be a soldering lug. The soldering lug is a welding rod used for soldering, and is a strip-like structure. Soldering can be used for hermetic metal welding in an environment other than high-temperature high-pressure conditions.

The support assembly 5 (soldering lugs) is placed symmetrically at the bottom of the component body 4 to steadily hold the component body 4 and form an off-contact structure as a gas escape space at the bottom of the component body 4. By using a difference of melting points between the solder paste and the soldering lugs, gas generated by the solder paste during melting can be evacuated through the off-contact structure, thereby preventing the gas from forming a void at the position of the solder paste layer 3. The soldering lugs begin to melt only after the solder paste has melted, thereby reasonably ensuring that most of the gas can be volatilized in all directions. At a flank of the component body 4, the position of the component body 4 is limited by a limiting post 62. By changing the thickness of the solder paste zone 61 at the bottom of the limiting post 62, the limiting post 62 is enabled to implement position limitation, thereby preventing an offset of the component body 4 during melting and welding.

According to some embodiments of this application, optionally, one end of the support assembly 5 is connected to the component body 4, and the other end of the support assembly 5 extends into the solder paste layer 3 to connect to the pad 2. By melting the solder paste layer 3 and the support assembly 5 in a soldering oven at a high temperature, the component body 4 and the limiting post 62 thereof are efficiently fixed to the pad 2 on the substrate 1.

According to some embodiments of this application, the support assembly 5 includes at least two pillars. This facilitates supporting of the component body 4. In addition, the support assembly 5 facilitates lifting of the component body 4, and helps to ensure the volatilization of gas and a relatively high welding speed.

According to some embodiments of this application, optionally, the support assembly 5 is axially symmetrically arranged along a vertical centerline of the component body 4. The axially symmetrically arranged support assembly 5 ensures that balanced supporting of the component body 4, and minimizes a horizontal offset in a process of melting the support assembly 5 and lowering the component body 4.

According to some embodiments of this application, optionally, the pillars are tin slugs. A melting point of the tin slugs is higher than a melting point of the solder paste, effectively ensuring the effect of the degassing space.

According to some embodiments of this application, optionally, a melting point of the support assembly 5 is greater than or equal to a melting point of the solder paste layer 3. This effectively ensures that the solder paste layer 3 is melted before the support assembly 5. In this way, time is enough for exhausting the gas from the degassing space before the process of melting the support assembly 5.

According to some embodiments of this application, optionally, a height of a pillar is greater than a thickness of the solder paste layer 3, thereby effectively ensuring that the pillar can lift the component body 4 to form the degassing space.

According to some embodiments of this application, a fixing assembly 6 for preventing an offset in a case of connecting the component body 4 to the pad 2 is disposed between the component body 4 and the pad 2, thereby further reducing the offset during the welding of the component body 4.

According to some embodiments of this application, optionally, the fixing assembly 6 includes a solder paste zone 61 and a limiting post 62. The solder paste zone 61 is disposed on the pad 2. One end of the limiting post 62 is connected to the component body 4, and the other end of the limiting post 62 is connected to the solder paste zone 61. The limiting post 62 facilitates a steady supporting and limiting structure to be formed at the flank of the component body 4.

The limiting post 62 in the printed circuit board may be a pin. The pin is also called a pin, and is pin in English. The pin is a connecting wire led out from an internal circuit of an integrated circuit (chip) to an peripheral circuit. All the pins constitute an interface of the chip. A pin is an end segment of a lead, joined by soldering to a pad on the printed circuit board to form a solder joint. The pin includes parts such as a bottom (bottom), a toe (toe), and a side (side).

According to some embodiments of this application, optionally, a thickness of the solder paste zone 61 is greater than a thickness of the solder paste layer 3. By increasing the thickness of the solder paste zone 61, the originally unconnected limiting post 62 is attached to the thickened solder paste to prevent the component body from being offset.

According to some embodiments of this application, optionally, the limiting post 62 is a pin, and the pin is an inherent component pin of the component body 4. The number of pin structures is usually two, but not limited to two, and may be more than two, thereby facilitating limitation of the position of the component body 4. The fixing assembly 6 that limits the offset of the component body 4 is component pin on the component body 4, thereby reducing the use cost of the position limiting solution.

According to some embodiments of this application, optionally, the limiting post 62 is in an inverted L shape, thereby facilitating a steady supporting and limiting structure to be formed at the flank of the component body.

According to some embodiments of this application, this application provides a battery module. The battery module includes the printed circuit board according to the foregoing embodiment.

According to some embodiments of this application, this application provides a battery pack 100, and the battery pack 100 includes the battery module.

According to some embodiments of this application, this application provides an electrical device. The electrical device includes a battery pack 100. The battery pack 100 is configured to provide electrical energy.

The electrical device may be any device or system that employs the battery.

According to some embodiments of this application, referring to FIG. 2 and FIG. 3, FIG. 2 is a schematic structural diagram of a printed circuit board according to some embodiments of this application, and FIG. 3 is a schematic structural diagram of a printed circuit board in the related art. This application provides a printed circuit board.

Soldering lugs are symmetrically placed at the bottom of the component body 4 to form to-be-welded pieces on a solder paste layer 3. The soldering lugs are off-contact from the component body 4 to form a gas volatilization space. At a flank of the component body, the component pin contacts the solder paste zone 61 to increase the thickness of the solder paste zone 61 that contacts the component pin. Through the contact between the component pin and the solder paste zone 61, the component body 4 is prevented from being offset in a welding process.

Finally, it needs to be noted that the foregoing embodiments are merely intended to describe the technical solutions of this application but not to limit this application. Although this application is described in detail with reference to the foregoing embodiments, a person of ordinary skill in the art understands that modifications may still be made to the technical solutions described in the foregoing embodiments, or equivalent replacements may still be made to some or all technical features thereof. The modifications and equivalent replacements, which do not make the essence of the corresponding technical solutions depart from the scope of the technical solutions of the embodiments of this application, fall within the scope of the claims and specification hereof. Particularly, to the extent that no structural conflict exists, various technical features mentioned in various embodiments may be combined in any manner. This application is not limited to the specific embodiments disclosed herein, but includes all technical solutions falling within the scope of the claims.

What is claimed is:

1. A printed circuit board, comprising:
   a substrate;
   a pad above the substrate;
   a solder paste layer above the pad;
   a component body above the solder paste layer; and
   a support assembly between the pad and the component body to form a degassing space between the component body and the solder paste layer,
   wherein one end of the support assembly is connected to the component body, and another end of the support assembly extends into the solder paste layer to directly connect to the pad,
   the support assembly is soldering lug, which has a higher melting point than solder paste in the solder paste layer,
   the printed circuit board further comprises a fixing assembly for preventing an offset in a case of connecting the component body to the pad between the component body and the pad,
   the fixing assembly comprises a solder paste zone and a limiting post, the solder paste zone is disposed on the pad, one end of the limiting post is connected to the component body, and another end of the limiting post is connected to the solder paste zone,
   the limiting post is disposed at a flank of the component body, and
   a thickness of the solder paste zone is greater than a thickness of the solder paste layer.

2. The printed circuit board according to claim 1, wherein the support assembly comprises at least two pillars.

3. The printed circuit board according to claim 2, wherein the pillars are tin slugs.

4. The printed circuit board according to claim 2, wherein the solder paste layer comprises solder paste which is composed of a mixture of tin solder powders, a flux, a surfactant, and a thixotropic agent.

5. The printed circuit board according to claim 2, wherein a height of each of the at least two pillars is greater than a thickness of the solder paste layer.

6. The printed circuit board according to claim 1, wherein the support assembly is axially symmetrically arranged along a vertical centerline of the component body.

7. The printed circuit board according to claim 1, wherein the limiting post is a pin, and the pin is an inherent component pin of the component body.

8. The printed circuit board according to claim 1, wherein the fixing assembly comprises at least two pins as limiting posts.

9. The printed circuit board according to claim 1, wherein the limiting post is in an inverted L shape.

10. A battery module, wherein the battery module comprises the printed circuit board according to claim 1, and the printed circuit board is located in the battery module.

11. A battery pack, wherein the battery pack comprises the battery module according to claim 10.

12. An electrical device, wherein the electrical device comprises the battery pack according to claim 11, and the battery pack is configured to provide electrical energy.

13. A battery module, wherein the battery module comprises the printed circuit board according to claim 1, and the printed circuit board is located in the battery module.

* * * * *